US012783028B2

(12) United States Patent
Stumpf et al.

(10) Patent No.: US 12,783,028 B2
(45) Date of Patent: Nov. 3, 2026

(54) SYSTEM AND METHOD FOR MONITORING LIQUID COOLANT IN AN INFORMATION HANDLING SYSTEM

(71) Applicant: DELL PRODUCTS L.P., Round Rock, TX (US)

(72) Inventors: Michael Stumpf, Cedar Park, TX (US); Sandor Farkas, Round Rock, TX (US)

(73) Assignee: Dell Products L.P., Round Rock, TX (US)

(*) Notice: Subject to any disclaimer, the term of this patent is extended or adjusted under 35 U.S.C. 154(b) by 1 day.

(21) Appl. No.: 18/901,298

(22) Filed: Sep. 30, 2024

(65) Prior Publication Data

US 2026/0093298 A1 Apr. 2, 2026

(51) Int. Cl.

| | |
|---|---|
| ***G06F 1/20*** | (2006.01) |
| ***G01N 21/27*** | (2006.01) |
| ***G01N 21/85*** | (2006.01) |
| *G08B 21/18* | (2006.01) |
| *H05K 7/20* | (2006.01) |

(52) U.S. Cl.

CPC ............... *G06F 1/20* (2013.01); *G01N 21/27* (2013.01); *G01N 21/85* (2013.01); *G08B 21/182* (2013.01); *H05K 7/20281* (2013.01)

(58) Field of Classification Search

CPC .......... G06F 1/20; G01N 21/27; G01N 21/85; G01N 21/251; G01N 21/78; G01N 21/31; G08B 21/182; H05K 7/20281; G06T 2207/10024; G06T 7/90

USPC .......................................................... 340/603

See application file for complete search history.

(56) References Cited

U.S. PATENT DOCUMENTS 7,113,280 B2* 9/2006 Oon ........................ G01N 21/85 356/406
11,191,185 B2* 11/2021 Chopra ................ H05K 7/2079
2005/0019934 A1* 1/2005 Duerr ...................... G01M 3/38 422/68.1
2017/0181327 A1 6/2017 Shelnutt et al.
2020/0378858 A1 12/2020 Curtis et al.
2024/0029539 A1* 1/2024 Subrahmanyam ........................... H05K 7/20272
2025/0172088 A1* 5/2025 S. ............................. F01P 11/14

* cited by examiner

*Primary Examiner* — Eric Blount
(74) *Attorney, Agent, or Firm* — Larson Newman, LLP

(57) ABSTRACT

A system is disclosed and includes an optical light sensor to determine an initial coolant color value associated with a coolant and an information handling system. The information handling system includes a memory to communicate with the optical light sensor to store the initial coolant color value, and a processor to communicate with the memory and the optical light sensor. The processor determines a current coolant color value associated with the coolant, compares the current coolant color value to the initial coolant color value, and determines whether the current coolant color value is different from the initial coolant color value.

18 Claims, 6 Drawing Sheets

SYSTEM AND METHOD FOR MONITORING LIQUID COOLANT IN AN INFORMATION HANDLING SYSTEM

FIELD OF THE DISCLOSURE

The present disclosure generally relates to information handling systems, and more particularly relates to monitoring liquid coolant in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A system is disclosed and includes an optical light sensor to determine an initial coolant color value associated with a coolant and an information handling system. The information handling system includes a memory to communicate with the optical light sensor to store the initial coolant color value, and a processor to communicate with the memory and the optical light sensor. The processor determines a current coolant color value associated with the coolant, compares the current coolant color value to the initial coolant color value, and determines whether the current coolant color value is different from the initial coolant color value.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
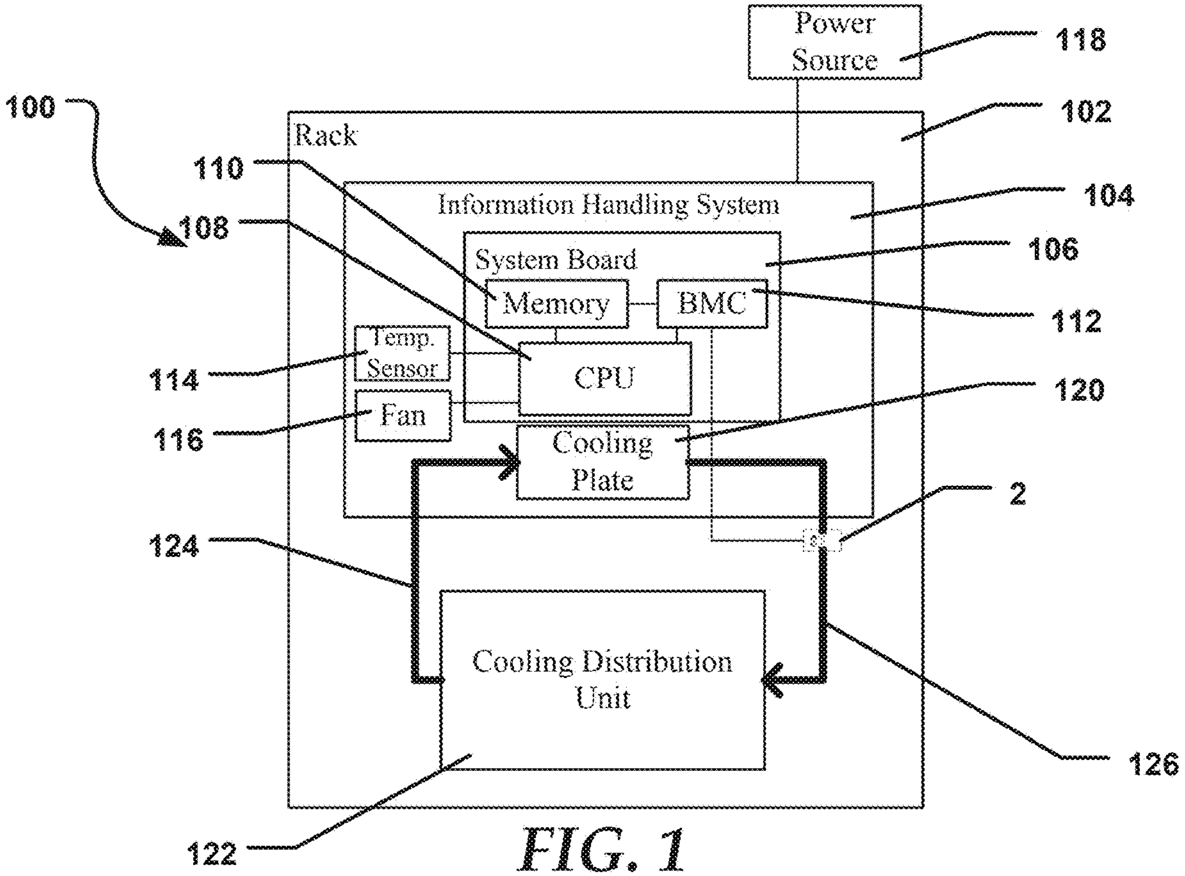
FIG. 1 is a block diagram of computing system according to an embodiment of the present disclosure.

FIG. 1 illustrates a system 100 that may include a rack 102, or cabinet, in which an information handling system 104 is installed, or otherwise disposed. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

As shown, the information handling system 104 may include a system board 106, or motherboard, on which a central processing unit (CPU) 108 is installed, or otherwise disposed. The information handling system 104 may also include a memory 110 coupled to the CPU 108. Moreover, a baseboard management controller 112 may be disposed on the system board 106 and may be coupled to the CPU 108 and the memory 110. Other components necessary to the operation of the information handling system 104, and well known in the art, may be disposed on the system board 106. The information handling system 104 may also include a temperature sensor 114 and a fan 116 adjacent the CPU 108. Additionally, the information handling system 104 may be coupled to a power source 118. The power source 118 may be an alternating current (AC) power source, a direct current (DC) power source, or a combination thereof. The power source 118 may provide power to all of the components described herein that required power to operate.

FIG. 1 further shows a cooling plate 120 adjacent the system board 106. Specifically, the cooling plate 120 is adjacent the CPU 108 which may generate and emit a substantial amount of heat during operation of the information handling system 102. A cooling distribution unit 122 may be connected to the cooling plate 120 via a coolant supply line 124 and a coolant return line 126. As such, the cooling distribution unit 122 is in fluid communication with the cooling plate 120 via the coolant supply line 124 and the coolant return line 126. During operation, the cooling distribution unit 122 may circulate coolant to the cooling plate 120 via the coolant supply line 124 and the coolant return line 126 in order to lower the temperature of the cooling plate 120 and therefore, transfer heat generated by the CPU 108 away from the CPU 108, and the system board 106, in order to lower the operating temperature of the CPU 108, the system board 106, and the other components disposed on the system board 106.

Figure 2:
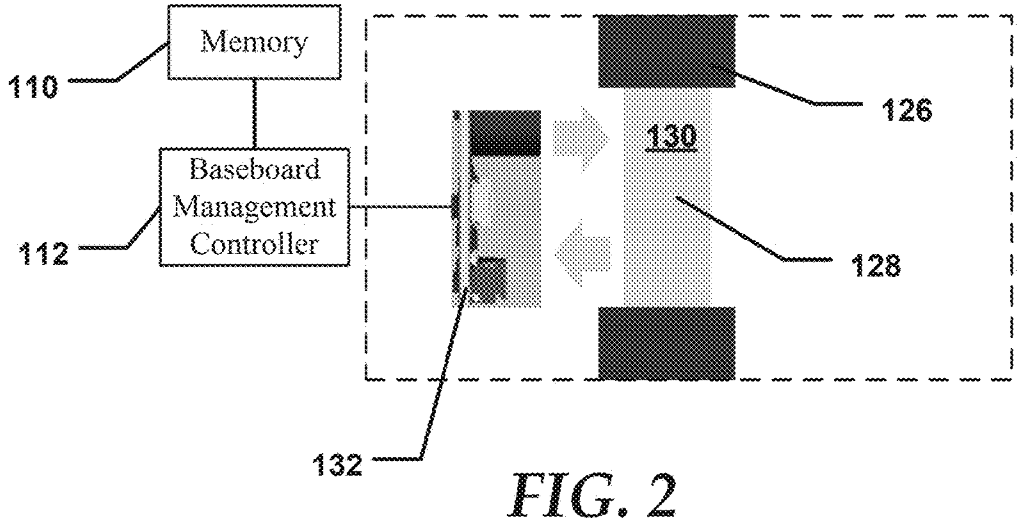
FIG. 2 is a detailed view of FIG. 1 taken at block 2 in FIG. 1 showing an optical light sensor adjacent a transparent cooling tube section according to an embodiment of the present disclosure.

FIG. 2 is a detailed view of FIG. 1 taken at box 2. As illustrated in FIG. 2, the system 100 may further include a transparent cooling tube section 128 disposed along the coolant return line 126 and a liquid coolant 130 may flow therethrough during operation of the system 100. Specifically, the liquid coolant 130 may flow through the transparent cooling tube section 128 (and the coolant supply line 124 and the coolant return line 126), as the cooling distribution unit 122 circulates the liquid coolant 130 to the cooling plate 120. As shown in FIG. 2, an optical light sensor 132 may be disposed adjacent the transparent cooling tube section 128. The optical light sensor 132 may be configured to detect and determine the color of the liquid coolant 130. For example, the optical light sensor 132 may output the color of the liquid coolant 130 using the CIE 1931 xy parameters as set forth by the Commission internationale de l'éclairage (CIE) (aka, the International Commission on Illumination) in 1931.

As further illustrated in FIG. 2, the baseboard management controller 112 may be coupled to the optical light sensor 130. As discussed in greater detail below, the optical light sensor 130 may determine an initial color of the liquid coolant 130 and send the color values to the baseboard management controller 112. The baseboard management controller 112 may store the initial color values associated with the liquid coolant 130 in the memory 110. Periodically, during operation, the optical light sensor 132 may detect the color values of the liquid coolant 130 real-time and send the current color values to the baseboard management controller 112. The baseboard management controller 112 may determine if a change in color of the liquid coolant 130 has occurred by comparing the current color values to the initial color values. If the change in color values are greater than a threshold, indicating a significant change in the color of the liquid coolant 130, the baseboard management controller 112 may issue an alert or warning. A significant change in the color values, for example, may be due to, and thereby indicate, contamination of the liquid coolant 130, chemical breakdown of the liquid coolant 130, aging of the liquid coolant 130, a high temperature of the liquid coolant 130, lack of liquid coolant 130, presence of bubbles in the liquid coolant 130 due to a low fluid level, or any combination thereof.

While the transparent cooling tube section 128 and the associated optical light sensor 132, adjacent thereto, are located along the coolant return line 126, as illustrated in FIG. 2, it is to be understood that the transparent cooling tube section 128 and the optical light sensor 132 may be disposed, or otherwise installed, along the coolant supply line 124.

Figure 3:
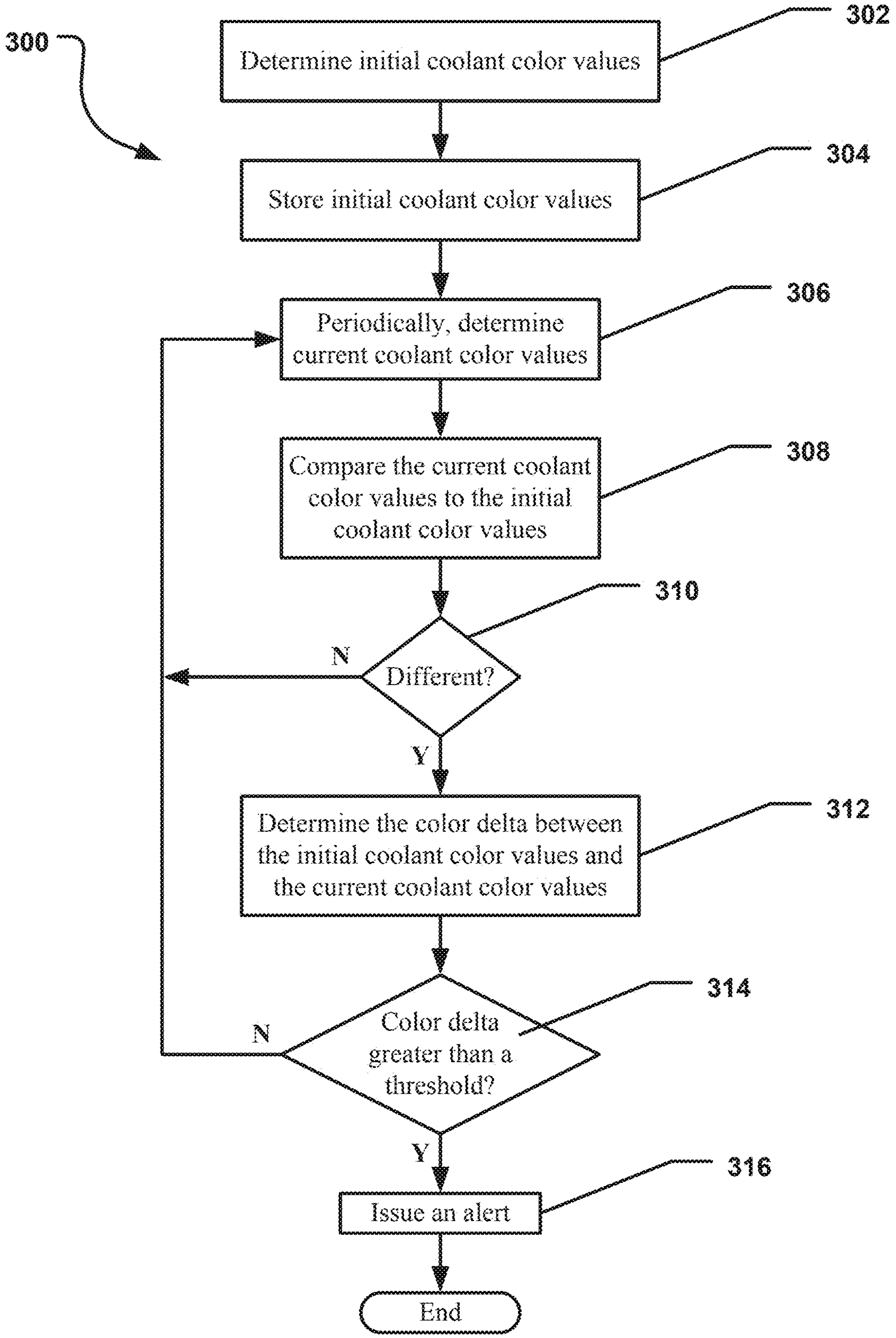
FIG. 3 is a flow diagram of a method for monitoring liquid coolant in an information handling system using an optical light sensor according to an embodiment of the present disclosure.

FIG. 3 is a flow diagram of a method 300 for monitoring liquid coolant in an information handling system using an optical light sensor according to at least one embodiment of the present disclosure, starting at block 302. It will be readily appreciated that not every method step set forth in this flow diagram is always necessary, and that certain steps of the methods may be combined, performed simultaneously, in a different order, or perhaps omitted, without varying from the scope of the disclosure. The method steps depicted in FIG. 3 may be executed, or employed in whole, or in part, by the baseboard management controller 112, the CPU 108 of the information handling system 104, a combination thereof, or any other type of controller, device, module, processor, or any combination thereof, operable to employ, or otherwise execute, all, or portions of, the method 300 of FIG. 3.

Figure 4:
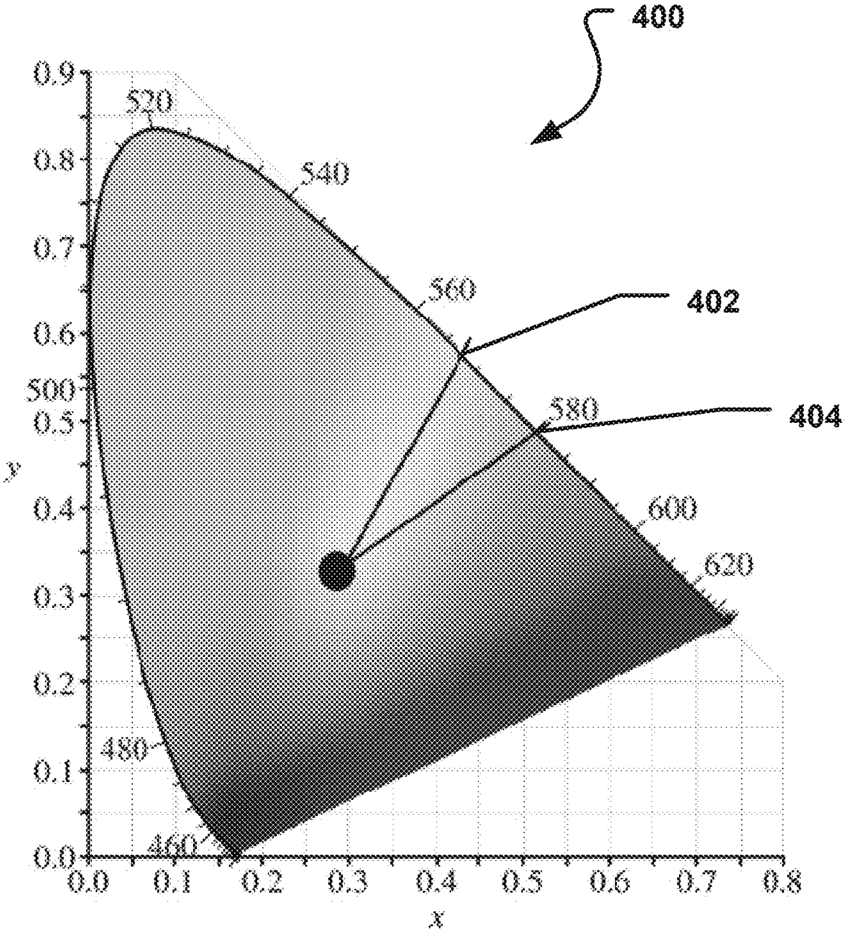
FIG. 4 is a graph showing various liquid coolant color values on the CIE 1931 xy chromaticity diagram.

Beginning at block 302, the method 300 may include determining the initial coolant color values. For example, the optical light sensor 132 may transmit a light signal toward the transparent cooling tube section 128, with the liquid coolant 130 therein, and receive reflected light from the transparent cooling tube section 128. The reflected light received by the optical light sensor indicates the color of the liquid coolant 130 in the transparent cooling tube section 128. The color of the liquid coolant 130 may be quantified using the CIE 1931 xy parameters shown in the chromaticity diagram 400 of FIG. 4 and, for example, may have an initial values as indicated at point 402. At block 304, the method 300 may include storing the initial coolant color values, e.g., in the memory 124 coupled to the baseboard management controller 122.

Moving to block 306, the method 300 may include periodically determining current color values for the liquid coolant 130 within the transparent cooling tube section 128 using the optical light sensor 132. The current coolant color values for the liquid coolant 130 may also be quantified using the CIE 1931 xy parameters shown in the chromaticity diagram 400 of FIG. 4 and for example, may have values as indicated at point 404. It is to be understood that the color values, when detected, may appear anywhere within the chromaticity diagram 400 of FIG. 4. For example, a particular color may stay on a straight line and the location may depend on the saturation. Changes in color may deviate from a straight line for a particular initial color.

At block 308, the method 300 may include comparing the current coolant color values to the initial coolant color values. At decision 310, the method 300 may include determining whether the current color values are different from the initial color values. If the current color values are not different from the initial color values, the method 300 returns to block 306 and continues as described herein.

Conversely, at decision 310, if the current coolant color values are different from the initial coolant color values, the method 300 may continue to block 312 where the method 300 may include determining the color delta between the initial coolant color values and the current coolant color values. It is to be understood that the color delta will indicate a change in the color of the liquid coolant 130. At decision step 312, the method 300 may include determining whether the color delta is greater than a predetermined threshold. If the color delta is not greater than the predetermined threshold, the method 300 may return to block 306 and continue as described herein. On the other hand, at decision 314, if the color delta is greater than the predetermined threshold, the method 300 may proceed to block 316 and the method 300 may include issuing an alert. Thereafter, the method 300 may end.

It is to be understood that the color delta may show that the color of the liquid coolant 130 is substantially darker which can indicate contamination. Further, the color delta may show that the color of the liquid coolant 130 is substantially lighter which can indicate aeration or bubbles in the liquid coolant 130. The color delta may also indicate chemical breakdown of the liquid coolant 130, aging of the liquid coolant 130, a high temperature of the liquid coolant 130, lack of liquid coolant 130, or any combination thereof.

Figure 5:
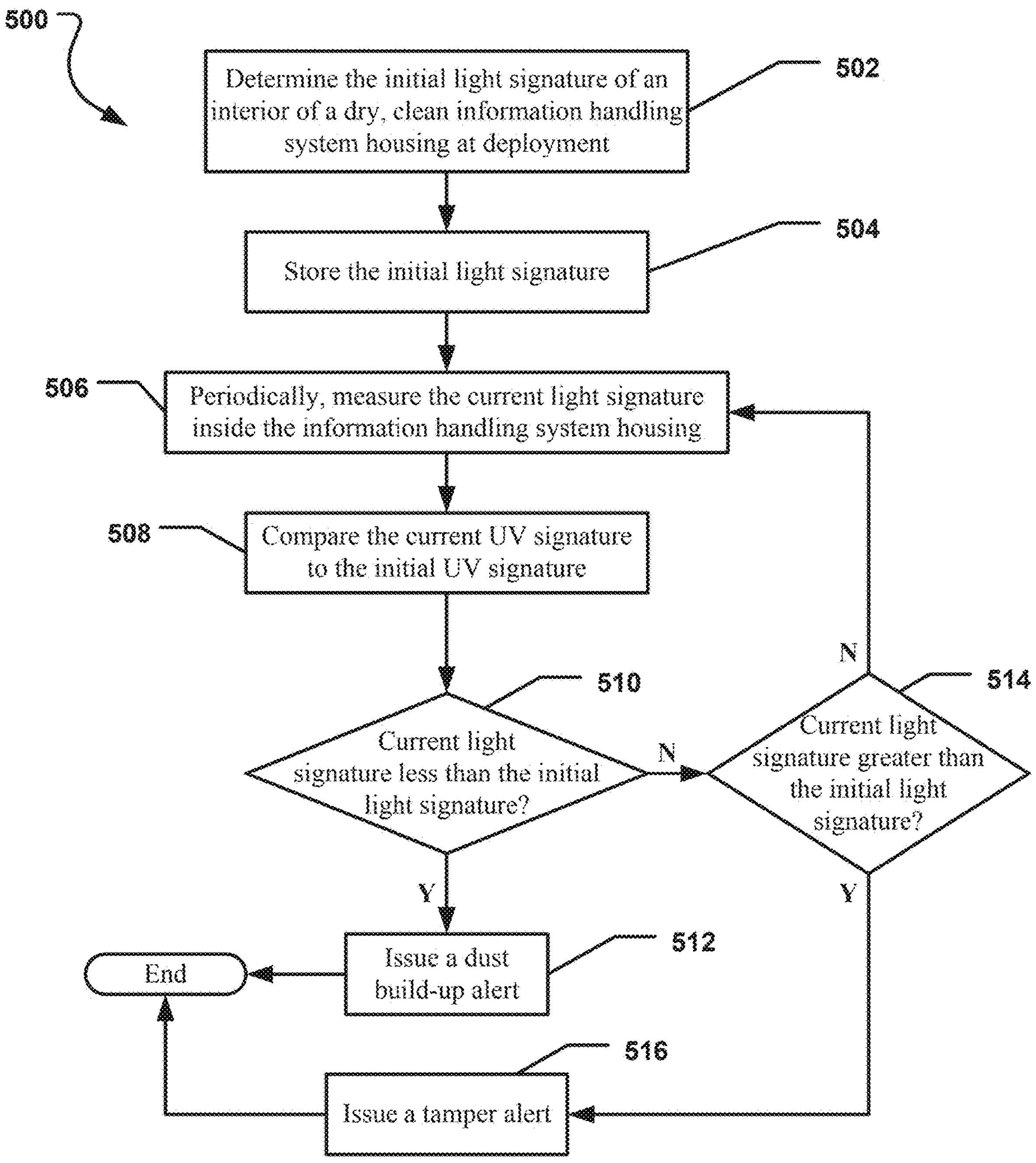
FIG. 5 is a flow diagram of a method for monitoring ultraviolet light inside a housing of an information handling system using an optical light sensor according to an embodiment of the present disclosure.

Referring now to FIG. 5, a flow diagram of a method 500 for monitoring ultraviolet light (UV) inside a housing of an information handling system using an optical light sensor according to an embodiment of the present disclosure is illustrated. It will be readily appreciated that not every method step set forth in this flow diagram is always necessary, and that certain steps of the methods may be combined, performed simultaneously, in a different order, or perhaps omitted, without varying from the scope of the disclosure. The method steps depicted in FIG. 5 may be executed, or employed in whole, or in part, by the baseboard management controller 122, the processor 106 of the information handling system 104, a combination thereof, or any other type of controller, device, module, processor, or any combination thereof, operable to employ, or otherwise execute, all, or portions of, the method 500 of FIG. 5.

Commencing at block 502, the method 500 may include determining the initial light signature of an interior of a dry, clean information handling system housing at deployment. The initial light signature may be determined using the optical light sensor 132 and may include values for infrared light, visible light, ultraviolet light, or any combination thereof. For example, the optical light sensor 132 may transmit a light signal inside the information handling system housing and receive reflected light from the various components within the information handling system. The reflected light is the initial light signature of the interior of the information handling system. At block 504, the method 500 may include storing the initial light signature of the interior of the information handling system housing.

Moving to block 506, the method 500 includes periodically, measuring the current light signature inside the server housing. Thereafter, at block 508, the method 500 includes comparing the current light signature to the initial light signature. At decision step 510, the method 500 may include determining whether all, or a portion of, the current light signature is less than, or lower than, the initial light signature. For example, dust build-up inside the housing of the information handling system will cause attenuation of the reflected UV light and therefore, cause the UV light value in the current light signature to be less than the UV light value in the initial light signature.

Figure 6:
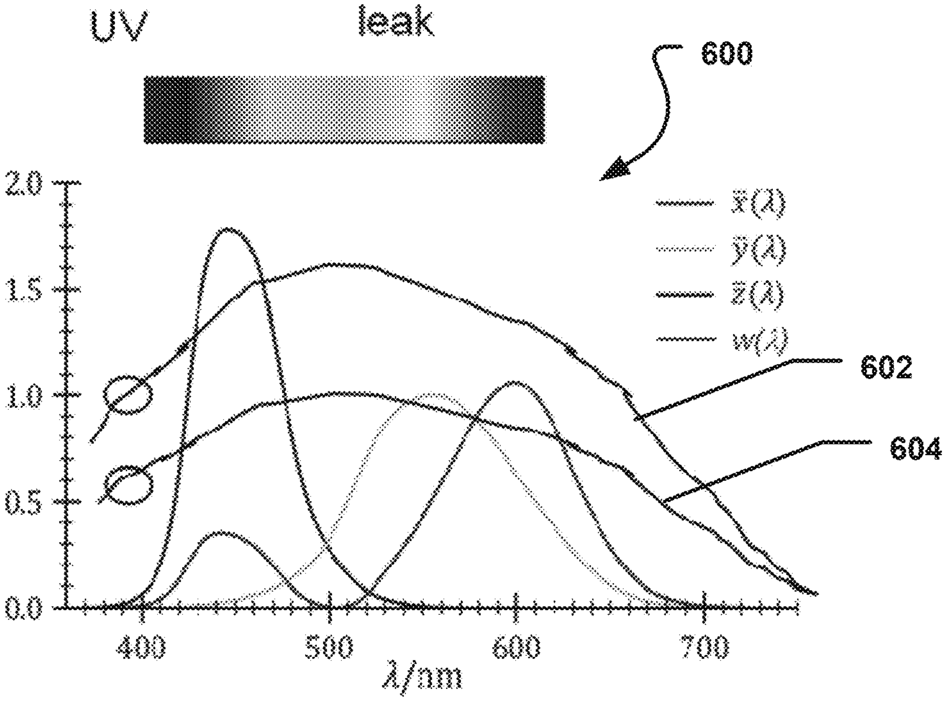
FIG. 6 is a first graph showing UV values inside a housing of an information handling system plotted against the CIE XYZ standard observer color matching functions according to an embodiment of the present disclosure.

FIG. 6 is a graph 600 including plots for UV light, visible light, and infrared light and illustrates the scenario in which the UV value 602 in the initial light signature is greater than the UV value 604 in the current light signature. Accordingly, at decision step 510, for example, if the UV value 604 within the current light signature, is less than the UV value 602 within the initial light signature, the method 500 may proceed to block 512 and the method 500 may include issuing a dust build-up alert. Thereafter, the method 500 may end.

Figure 7:
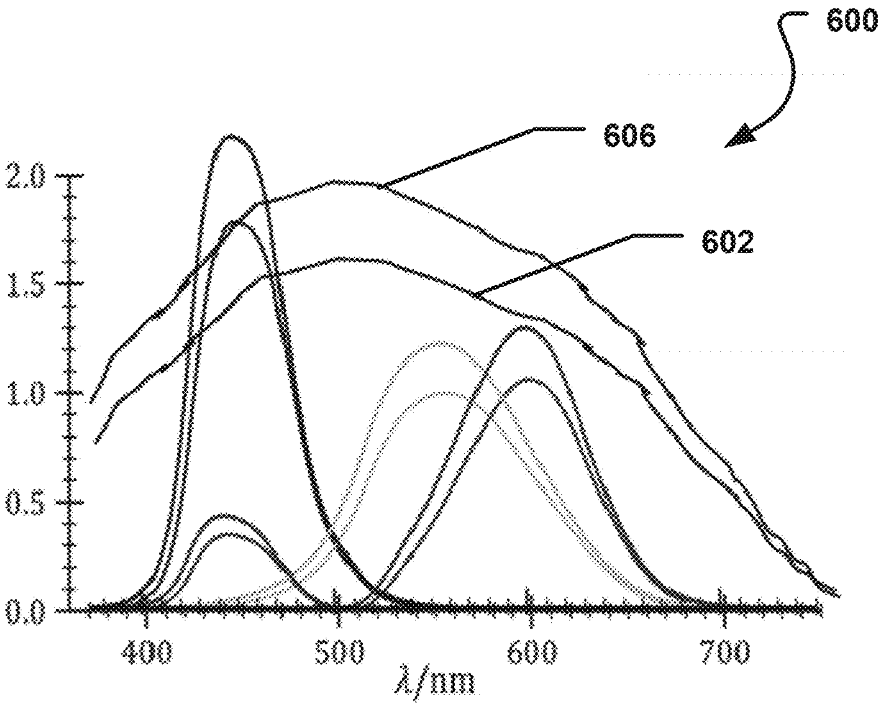
FIG. 7 is a second graph showing UV values inside a housing of an information handling system against the CIE XYZ standard observer color matching functions according to an embodiment of the present disclosure.

Returning to decision 510, if none of the values within current light signature are less than the values within initial light signature, the method 500 may proceed to decision 514 where the method 500 may include determining whether all, or a portion of, the current light signature is greater than initial light signature, i.e., due to excessive light inside of the housing of the information handling system. FIG. 7 includes the graph 600 including plots for UV light, visible light, and infrared light and illustrates the scenario in which the UV value 606 within the current light signature is greater than the UV value 602 within the initial light signature. For example, if the UV value 606 in the current light signature is greater than the UV value 602 in the initial light signature, the method 500 may proceed to block 516 and the method 500 may include issuing a tamper alert due to a sudden increase in light within the housing of the information handling system. Thereafter, the method 500 may end. Conversely, at decision step 514, if none of the values within the current light signature are greater than the initial light signature, indicating that the current light signature is substantially the same as the initial light signature, the method 500 may return to block 506 and continue as described herein.

Figure 8:
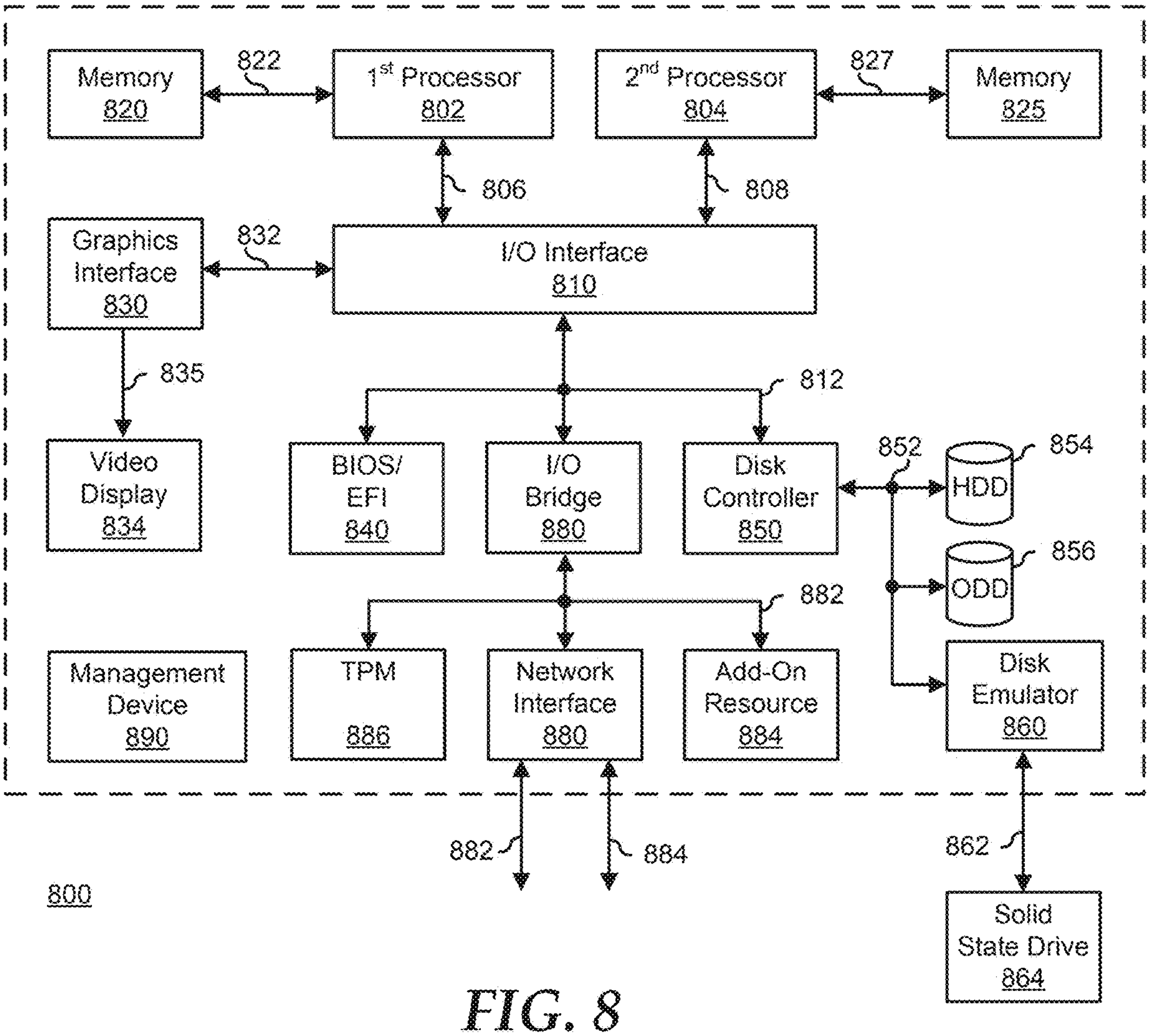
FIG. 8 is a block diagram of a general information handling system according to an embodiment of the present disclosure.

FIG. 8 shows a generalized embodiment of an information handling system 800 according to an embodiment of the present disclosure. Information handling system 800 may be substantially similar to information handling system 104 of FIG. 1. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 can include devices or modules that embody one or more of the devices or modules described below and operates to perform one or more of the methods described herein. Information handling system 800 includes a processors 802 and 804, an input/output (I/O) interface 810, memories 820 and 825, a graphics interface 830, a basic input and output system/universal extensible firmware interface (BIOS/UEFI) module 840, a disk controller 850, a hard disk drive (HDD) 854, an optical disk drive (ODD) 856, a disk emulator 860 connected to an external solid state drive (SSD) 864, an I/O bridge 870, one or more add-on resources 874, a trusted platform module (TPM) 876, a network interface 880, a management device 890, and a power supply 895. Processors 802 and 804, I/O interface 810, memory 820, graphics interface 830, BIOS/UEFI module 840, disk controller 850, HDD 854, ODD 856, disk emulator 860, SSD 864, I/O bridge 870, add-on resources 874, TPM 876, and network interface 880 operate together to provide a host environment of information handling system 800 that operates to provide the data processing functionality of the information handling system. The host environment operates to execute machine-executable code, including platform BIOS/UEFI code, device firmware, operating system code, applications, programs, and the like, to perform the data processing tasks associated with information handling system 800.

In the host environment, processor 802 is connected to I/O interface 810 via processor interface 806, and processor 804 is connected to the I/O interface via processor interface 808. Memory 820 is connected to processor 802 via a memory interface 822. Memory 825 is connected to processor 804 via a memory interface 827. Graphics interface 830 is connected to I/O interface 810 via a graphics interface 832 and provides a video display output 836 to a video display 834. In a particular embodiment, information handling system 800 includes separate memories that are dedicated to each of processors 802 and 804 via separate memory interfaces. An example of memories 820 and 830 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 840, disk controller 850, and I/O bridge 870 are connected to I/O interface 810 via an I/O channel 812. An example of I/O channel 812 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 810 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 840 includes BIOS/UEFI code operable to detect resources within information handling system 800, to provide drivers for the resources, initialize the resources, and access the resources. BIOS/UEFI module 840 includes code that operates to detect resources within information handling system 800, to provide drivers for the resources, to initialize the resources, and to access the resources.

Disk controller 850 includes a disk interface 852 that connects the disk controller to HDD 854, to ODD 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits SSD 864 to be connected to information handling system 800 via an external interface 862. An example of external interface 862 includes a USB interface, an IEEE 8394 (Firewire) interface, a proprietary interface, or a combination thereof. Alternatively, solid-state drive 864 can be disposed within information handling system 800.

I/O bridge 870 includes a peripheral interface 872 that connects the I/O bridge to add-on resource 874, to TPM 876, and to network interface 880. Peripheral interface 872 can be the same type of interface as I/O channel 812 or can be a different type of interface. As such, I/O bridge 870 extends the capacity of I/O channel 812 when peripheral interface 872 and the I/O channel are of the same type, and the I/O bridge translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as I/O interface 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

Management device 890 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 800. In particular, management device 890 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 800, such as system cooling fans and power supplies. Management device 890 can include a network connection to an external management system, and the management device can communicate with the management system to report status information for information handling system 800, to receive BIOS/UEFI or system firmware updates, or to perform other task for managing and controlling the operation of information handling system 800.

Management device 890 can operate off of a separate power plane from the components of the host environment so that the management device receives power to manage information handling system 800 when the information handling system is otherwise shut down. An example of management device 890 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 890 may further include associated memory devices, logic devices, security devices, or the like, as needed, or desired.

Accordingly, using the systems and methods described herein, an optical light sensor may be used to detect subtle changes in the coolant color. It happens that over time the fluorescent color of the liquid may change, indicating contamination, chemical breakdown, aging, over temperature, lack of liquid, presence of bubbles, or a combination thereof. A specific coolant with a particular dye color may be characterized during installation and the CIE 1931 xy parameters associated with that color can be stored for reference in OLS flash memory or in iDRAC. For example, color monitoring may be performed online or offline, then compared against stored reference. Moreover, color monitoring may be performed during real time (i.e., runtime), using a short transparent section in a liquid loop and dedicating an OLS to detect the color of the liquid in the transparent section. An offline audit may be performed using a handheld version of OLS to analyze a sample color via the transparent section. If the coolant color deviates from the reference color by a pre-determined amount, or delta, an alert may be issued.

In another aspect, the measured CIE 1931 xy parameters may be passed to other OLS modules to be used as color reference. The shared reference point and the zero color (black/white) points may define a line in the chart. Any coolant/dye related color will be on this line, with the location depending on distance and size of leak. Other OLS modules may use this line to determine if their own detected color is due to a leak, or from a foreign object. With this adaptive color reference scheme, leak detection will not be impacted by any liquid color shift.

In still another aspect, the optical signature (UV signature) of a dry, clean system can be characterized at deployment and the XYZW parameters can be stored as reference. If intrusion occurs, the optical signature (UV signature) is different from other valid conditions. A W reading will increase as ambient light is detected, even in a darkened data center. The XYZ channels may register an increase as well, but the overall color will not be aligned with the dye wavelength. The timing of such an event is also significant, as all channels of an OLS will react to ambient light changes simultaneously. If the system contains multiple OLS modules, all OLS modules will report this condition. Typically, a fluid leak may trigger a single OLS. Once a tamper is event detected, iDRAC may be notified.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A system comprising:
an optical light sensor to determine an initial coolant color value associated with a coolant; and
an information handling system comprising:
a memory to communicate with the optical light sensor to store the initial coolant color value;
a processor to communicate with the memory and the optical light sensor, the processor to:
determine a current coolant color value associated with the coolant;
compare the current coolant color value to the initial coolant color value;
determine whether the current coolant color value is different from the initial coolant color value; and
determine an initial ultraviolet signature of an interior of an information handling system housing; and
store the initial ultraviolet signature;
a central processing unit; and
a cooling plate adjacent thereto, wherein the coolant circulates through the cooling plate to transfer heat away from the central processing unit.

2. The system of claim 1, wherein the processor further to:
determine a color delta between the current coolant color value and the initial coolant color value.

3. The system of claim 2, wherein the processor further to:
determine whether the color delta is greater than a predetermined threshold.

4. The system of claim 3, wherein the processor further to:
issue an alert when the color delta is greater than the predetermined threshold.

5. The system of claim 1, further comprising:
a cooling distribution unit in fluid communication with the cooling plate via a coolant supply line and a coolant return line.

6. The system of claim 5, further comprising:
a transparent cooling tube section disposed along the coolant supply line or the coolant return line, wherein at least a portion of the coolant flows through the transparent cooling tube section.

7. The system of claim 6, wherein the optical light sensor is adjacent the transparent cooling tube section to sense a color of the coolant circulating therethrough.

8. A method comprising:
determining an initial coolant color value;
storing, by a processor of an information handling system, the initial coolant color value;
determining a current coolant color value;
comparing the current coolant color value to the initial coolant color value; and
determining an initial ultraviolet signature of an interior of an information handling system housing; and
storing, by a processor of an information handling system, the initial ultraviolet signature.

9. The method of claim 8, further comprising:
determining whether the current coolant color value is different from the initial coolant color value.

10. The method of claim 9, further comprising:

determining whether a color delta between the current coolant color value and the initial coolant color is greater than a threshold.

11. The method of claim 10, further comprising:

issuing an alert when the color delta is greater than a threshold.

12. The method of claim 8, further comprising:

determining a current ultraviolet signature of the interior of the information handling system housing.

13. The method of claim 12, further comprising:

comparing the current ultraviolet signature to the initial ultraviolet signature.

14. The method of claim 13, further comprising:

issuing a dust build-up alert when the current ultraviolet signature is less than the initial ultraviolet signature; and issuing a tamper alert when the current ultraviolet signature is greater than the initial ultraviolet signature.

15. A system comprising:

a cooling distribution unit to circulate a coolant;

an optical sensor disposed along a supply line or return line of the cooling distribution unit; and an information handling system comprising:

a central processing unit;

a cooling plate adjacent the central processing unit, the cooling plate in fluid communication with the cooling distribution unit via the supply line and the return line;

a memory to store an initial coolant color value associated with the coolant; and a processor to communicate with the memory and the optical light sensor, the processor to:

determine a current coolant color value associated with the coolant;

compare the current coolant color value to the initial coolant color value;

determine whether the current coolant color value is different from the initial coolant color value; and determine an initial ultraviolet signature of an interior of an information handling system housing; and store the initial ultraviolet signature.

16. The system of claim 15, further comprising:

a transparent cooling tube section disposed along the coolant supply line or the coolant return line, wherein at least a portion of the coolant flows through the transparent cooling tube section.

17. The system of claim 16, wherein the optical light sensor is adjacent the transparent cooling tube section to sense a color of the coolant circulating therethrough.

18. The system of claim 17, wherein the processor further to:

determine a color delta between the initial coolant color value and the current coolant color value; and issue an alert when the color delta is greater than a predetermined threshold.

* * * * *